United States Patent
Lee et al.

(10) Patent No.: US 9,583,732 B2
(45) Date of Patent: Feb. 28, 2017

(54) ORGANIC LIGHT EMITTING DISPLAY APPARATUS AND METHOD OF MANUFACTURING THE SAME

(71) Applicant: LG Display Co., Ltd., Seoul (KR)

(72) Inventors: Jae Young Lee, Paju-si (KR); Tae-Kyung Kim, Yeosu-si (KR); Hae Ri Huh, Goyang-si (KR); Hun Hoe Heo, Daejeon (KR); Ji-Min Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/723,047

(22) Filed: May 27, 2015

(65) Prior Publication Data
US 2015/0349294 A1 Dec. 3, 2015

(30) Foreign Application Priority Data
May 28, 2014 (KR) ........................ 10-2014-0064735

(51) Int. Cl.
H01L 51/52 (2006.01)
H01L 27/32 (2006.01)

(52) U.S. Cl.
CPC ...... *H01L 51/5253* (2013.01); *H01L 27/3244* (2013.01); *H01L 51/524* (2013.01); *H01L 51/5246* (2013.01); *H01L 2251/303* (2013.01); *H01L 2251/5338* (2013.01); *H01L 2251/558* (2013.01)

(58) Field of Classification Search
CPC combination set(s) only.
See application file for complete search history.

(56) References Cited

U.S. PATENT DOCUMENTS

| | | | |
|---|---|---|---|
| 2010/0221481 A1* | 9/2010 | Allred | G11B 7/2433 428/64.7 |
| 2011/0100458 A1 | 5/2011 | Kang et al. | |
| 2012/0091477 A1 | 4/2012 | Kim | |
| 2012/0227809 A1* | 9/2012 | Bharti | C09J 7/0296 136/259 |
| 2012/0305981 A1* | 12/2012 | Park | H01L 51/5253 257/100 |
| 2013/0034685 A1* | 2/2013 | An | H01L 51/524 428/121 |
| 2013/0229108 A1* | 9/2013 | Chen | H01L 51/5253 313/511 |
| 2014/0021499 A1 | 1/2014 | Jang | |
| 2014/0117336 A1* | 5/2014 | Kim | H01L 51/5246 257/40 |
| 2015/0115235 A1 | 4/2015 | Lee et al. | |

FOREIGN PATENT DOCUMENTS

JP 2013-187019 A 9/2013

* cited by examiner

*Primary Examiner* — Kyoung Lee
*Assistant Examiner* — Ratisha Mehta
(74) *Attorney, Agent, or Firm* — Fenwick & West LLP (57) ABSTRACT

A flexible organic light emitting display apparatus comprising a flexible encapsulation layer comprising at least one aluminum oxide layer configured to cover an area having a plurality of pixels, a flexible barrier film comprising a flexible barrier film body and a pressure sensitive adhesive layer on the flexible encapsulation layer and an adhesion supporter directly contacting the aluminum oxide layer and the pressure sensitive adhesive layer.

12 Claims, 9 Drawing Sheets

ORGANIC LIGHT EMITTING DISPLAY APPARATUS AND METHOD OF MANUFACTURING THE SAME

CROSS-REFERENCE TO RELATED APPLICATIONS

This application claims the benefit of Korean Patent Application No. 10-2014-0064735 filed on May 28, 2014, which is hereby incorporated by reference as if fully set forth herein.

BACKGROUND

Field of the Invention

The present disclosure relates to a flexible organic light emitting display apparatus that can be used as a flexible display apparatus and a method of manufacturing the same.

Discussion of the Related Art

Recently, the field of display apparatuses, which visually express an electrical information signal, is rapidly advancing. Therefore, research is being continuously conducted for developing flat panel display (FPD) and other types of display apparatuses having excellent performance such as thinness, lightness, low power consumption, etc. Representative examples of such FPD apparatuses include liquid crystal display (LCD) apparatuses, plasma display panel (PDP) apparatuses, field emission display (FED) apparatuses, electro-wetting display (EWD) apparatuses, etc. The FPD apparatuses each include a flat display panel for realizing an image. The FPD apparatuses each have a structure where a pair of substrates are bonded facing each other with a unique emitting material or polarizing material therebetween, and includes a display which has a display area and a non-display area at a periphery of the display area. The display area is defined as an area having a plurality of pixels.

Recently, flexible display apparatuses which use a flexible substrate formed of a flexible material such as plastic, and can maintain a display performance despite being bent like paper, are being developed for replacing the FPD apparatuses. Such flexible display apparatuses may be widely applied to various fields compared to existing display apparatuses with no flexibility, and thus, research and development for commercializing the flexible display apparatuses are being done continuously. Also, OLED apparatuses display an image by using an organic light emitting device which is a self-emitting device. That is, the OLED apparatuses each include a plurality of pixels which each include an organic light emitting device.

The organic light emitting device includes first and second electrodes, which face each other, and an emission layer which is formed of an organic material between the first and second electrodes and emits electroluminescent light, based on a driving current between the first and second electrodes. However, the emission layer formed of an organic material is easily and quickly deteriorated due to water and oxygen. Water may be referred as moisture, water or vapor. Therefore, general organic light emitting display apparatuses include an encapsulation part that protects water and oxygen from permeating into an organic layer. Generally, the encapsulation part uses an inorganic substrate which has an excellent characteristic of delaying the permeation of water.

General organic light emitting display apparatuses each include an array substrate where a plurality of thin film transistors (TFTs) are formed, a pixel part which is provided on the array substrate and includes an organic light emitting device driven by a plurality of TFTs, and an encapsulation part that seals the array substrate with the pixel part therebetween.

When a water/oxygen permeation path occurs in the encapsulation part, lifetime and reliability of an organic light emitting display apparatus are reduced.

The encapsulation part of the related art has a multi-layer structure where a silicon-based organic insulation layer, a silicon-based inorganic insulation layer, a silicon-based organic insulation layer, and a silicon-based inorganic insulation layer are repeated in order multiple times. However, the encapsulation part is thick, and thus, when the encapsulation part is bent, a crack easily occurs. For this reason, it is difficult to apply the encapsulation part of the related art to a flexible display apparatus.

SUMMARY

Recently, flexible organic light emitting display apparatuses are being actively researched. The flexible organic light emitting display apparatus is a next-generation display apparatus and may be folded or bent unlike a related art FPD apparatus. Particularly, the flexible organic light emitting display apparatus may be manufactured in a light and thin structure and enables an innovatively light and thin electronic device to be manufactured.

In order to manufacture the flexible organic light emitting display apparatus capable of being used for a long time, the inventors have researched a flexible encapsulation structure which is thin and is good in delaying the permeation of water. Particularly, the inventors have researched on an optically transparent encapsulation structure suitable for a top emission type.

In the flexible organic light emitting display apparatus, a flexible encapsulation layer for protecting the organic light emitting device from permeation of water and oxygen is formed in a vacuum chamber. In order to secure reliability of an organic light emitting display apparatus, a flexible encapsulation layer including an aluminum oxide layer is formed by atomic layer deposition (ALD) technology. However, to realize sufficient flexibility of the flexible encapsulation layer, the thickness should be minimum, hence, the flexible encapsulation layer could not alone delay water permeation enough to enable the flexible organic light emitting display apparatus to be commercialized, and thus, a process of adhering a flexible barrier film that further protects the permeation of water and oxygen is additionally applied after an ALD process.

However, an adhesive strength of an interface between the flexible encapsulation layer and a pressure sensitive adhesive (PSA) layer which is formed on one surface of the flexible barrier film is weak, and for this reason, when the flexible organic light emitting display apparatus is used for a long time, the flexible barrier film is detached from the flexible encapsulation layer. Particularly, when the flexible organic light emitting display apparatus is bent, the flexible barrier film is more easily delaminated from the flexible encapsulation layer.

Accordingly, the present disclosure is directed to providing a flexible organic light emitting display apparatus and a method of manufacturing the same that substantially obviate one or more problems due to limitations and disadvantages of the related art.

An aspect of the present disclosure is directed to providing a flexible organic light emitting display apparatus and a method of manufacturing the same, which suppresses the detachment of a PSA layer, which attaches a flexible barrier film to a flexible encapsulation layer formed of aluminum oxide, and improves lifetime and reliability.

The objects of the present disclosure are not limited to the aforesaid, but other objects not described herein will be clearly understood by those skilled in the art from descriptions below.

Additional advantages and features of the present disclosure will be set forth in part in the description which follows and in part will become apparent to those having ordinary skill in the art upon examination of the following or may be learned from practice of the present disclosure. The objectives and other advantages of the present disclosure may be realized and attained by the structure particularly pointed out in the written description and claims hereof as well as the appended drawings.

To achieve these and other advantages and in accordance with the purpose of the present disclosure, as embodied and broadly described herein, there is provided a flexible organic light emitting display apparatus including: a flexible array substrate configured to include a plurality of thin film transistors (TFTs) which are formed in an area having a plurality of pixels (display area); a pixel part configured to include a plurality of organic light emitting devices which are formed on the flexible array substrate in the area having a plurality of pixels; a flexible encapsulation layer formed opposite to the flexible array substrate with the pixel part therebetween; a flexible barrier film formed to cover an upper surface of the flexible encapsulation layer and configured to include a pressure sensitive adhesive (PSA) layer; and an adhesion supporter formed on the flexible encapsulation layer and adhered to the PSA layer.

The PSA layer may be formed of one selected from an olefin-based material, an acrylic-based material, and a silicon-based material which have optically transparent properties.

The PSA layer may be formed of the olefin-based material having hydrophobicity and adhesiveness, and an adhesive strength of the PSA layer may increase according to a pressure applied to the PSA layer.

The PSA layer may be a flexible double-sided adhesive film and may be adhered onto the flexible encapsulation layer.

The PSA layer may have a thickness of 8 μm to 50 μm.

The flexible encapsulation layer may be formed of aluminum oxide to have a thickness of 20 nm to 50 nm.

The flexible encapsulation layer may have a triple-layer structure where a first insulation layer, a second insulation layer, and a foreign material compensation layer are stacked, and the foreign material compensation layer may be disposed between the first insulation layer and the second insulation layer.

Overall thicknesses of the first and second insulation layers may be 40 nm to 100 nm, and the foreign material compensation layer may have a thickness of 2 μm to 4 μm.

The foreign material compensation layer may be formed of SiOCz.

The adhesion supporter may include silicon, the adhesion supporter may be formed of one selected from SiNx, SiOy, and SiOCz, and an adhesive strength of an interface between the adhesion supporter and the PSA layer may be equal to or more than 900 gf/inch.

The adhesion supporter may have a thickness of 2,000 Å to 5,000 Å.

The flexible barrier film may be optically isotropic.

The flexible barrier film may be formed to a thickness of 35 μm to 60 μm.

The flexible barrier film may be formed of one selected from copolyester thermoplastic elastomer (COP), cycoolefin copolymer (COC), and polycarbonate (PC).

In another aspect of the present disclosure, there is provided a method of manufacturing a flexible organic light emitting display apparatus including: forming a flexible array substrate including a plurality of thin film transistors (TFTs) which are formed in an area having a plurality of pixels; forming a pixel part including a plurality of organic light emitting devices which are formed on the flexible array substrate in the area having a plurality of pixels; forming a flexible encapsulation layer on the pixel part; forming an adhesion supporter on the flexible encapsulation layer; and adhering a flexible barrier film, including a pressure sensitive adhesive (PSA) layer, onto the adhesion supporter.

The forming of the flexible encapsulation layer may include forming an aluminum oxide layer to a thickness of 20 nm to 50 nm through an atomic layer deposition (ALD) process.

The forming of the flexible encapsulation layer may include forming a foreign material compensation layer on the flexible encapsulation layer by reacting oxygen (O2) with hexamethyldisiloxane (HMDSO), the foreign material compensation layer being formed of SiOCz and having a thickness of 2 μm to 4 μm.

The forming of the flexible encapsulation layer may include further forming an aluminum oxide layer on the foreign material compensation layer through an atomic layer deposition (ALD) process, the aluminum oxide layer having 20 nm to 50 nm.

The forming of the adhesion supporter may include forming a silicon-based layer to a thickness of 2,000 Å to 5,000 Å through a chemical vapor deposition (CVD) process.

The adhering of the flexible barrier film onto the adhesion supporter may include adhering the flexible barrier film onto the adhesion supporter by applying pressure.

It is to be understood that both the foregoing general description and the following detailed description of the present disclosure are exemplary and explanatory and are intended to provide further explanation of the present disclosure as claimed.

BRIEF DESCRIPTION OF THE DRAWINGS

The accompanying drawings, which are included to provide a further understanding of the present disclosure and are incorporated in and constitute a part of this application, illustrate exemplary embodiments of the present disclosure and together with the description serve to explain the principle of the present disclosure. In the drawings.

DETAILED DESCRIPTION OF THE INVENTION

Reference will now be made in detail to the exemplary embodiments of the present disclosure, examples of which are illustrated in the accompanying drawings. Wherever possible, the same reference numbers will be used throughout the drawings to refer to the same or like parts.

Hereinafter, a flexible organic light emitting display apparatus and a method of manufacturing the same according to exemplary embodiments of the present disclosure will be described in detail with reference to the accompanying drawings. First, a flexible organic light emitting display apparatus according to an embodiment of the present disclosure will be described in detail with reference to FIGS. 1 to 4.

Figure 1:
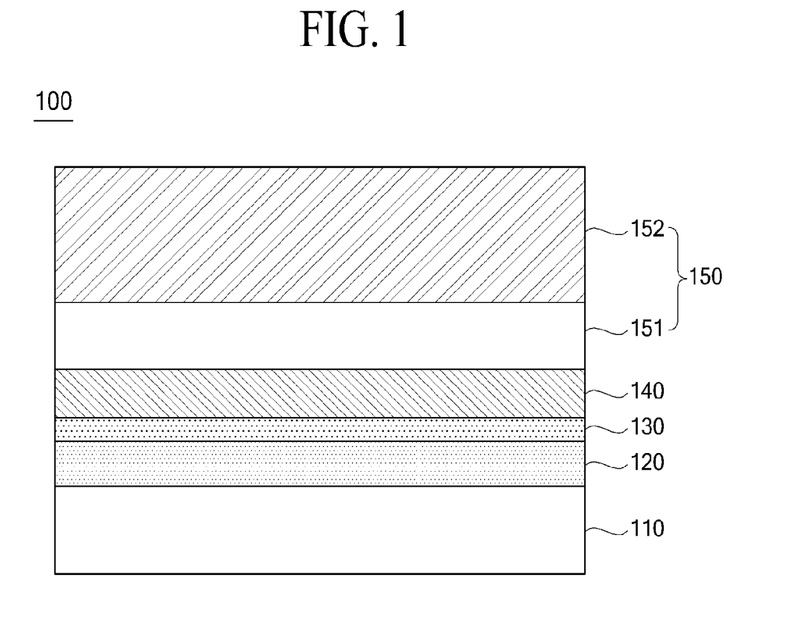
FIG. 1 is a cross-sectional view illustrating a portion of a flexible organic light emitting display apparatus according to an exemplary embodiment of the present disclosure.
Figure 3:
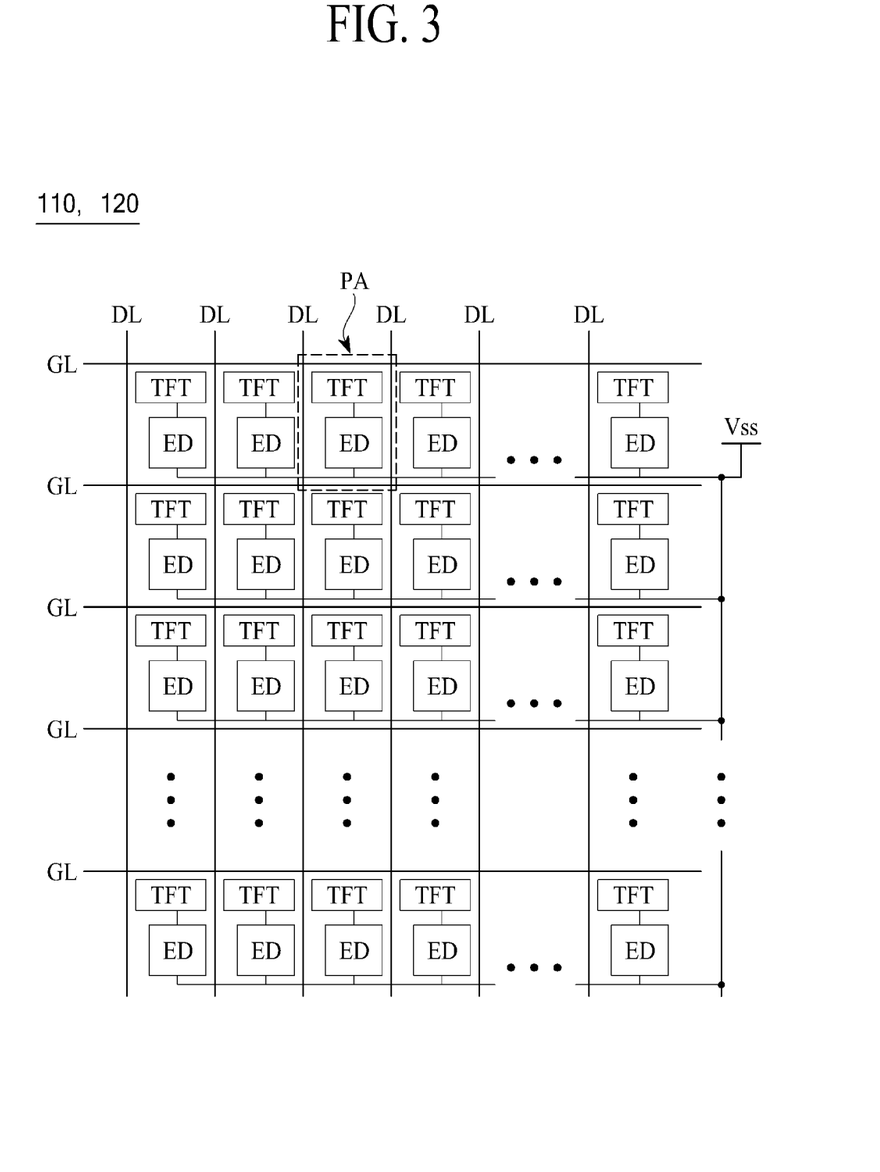
FIG. 3 is an equivalent circuit diagram illustrating a flexible array substrate and a pixel part of FIG. 1.
Figure 4:
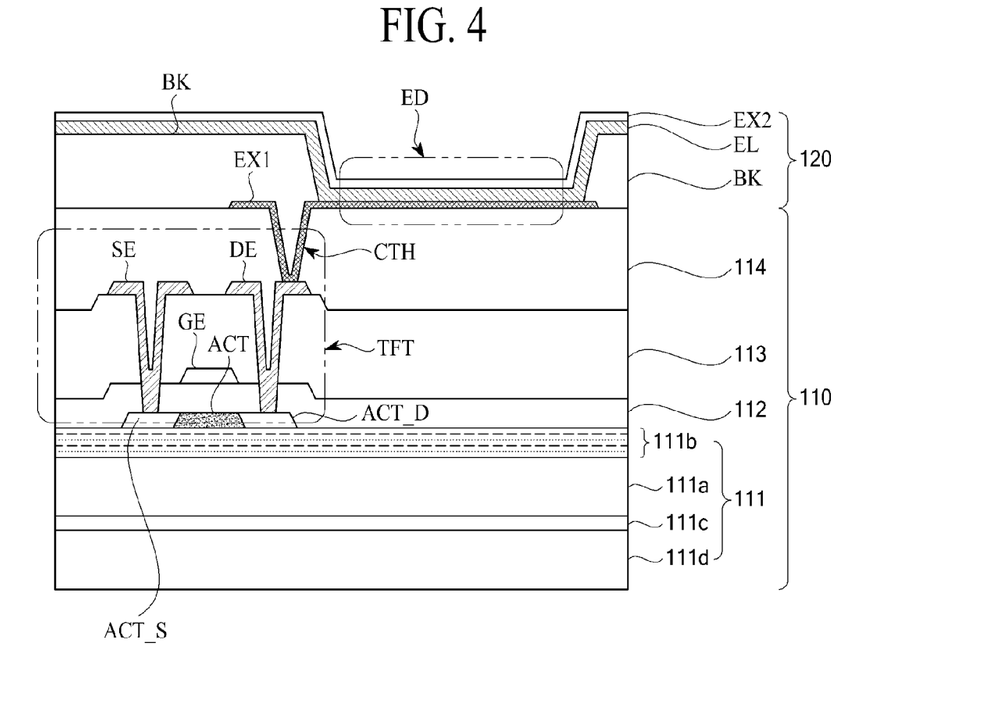
FIG. 4 is a cross-sectional view illustrating an example of a flexible array substrate and a pixel part for each pixel illustrated in FIG. 3.

FIG. 1 is a cross-sectional view illustrating a portion of a flexible organic light emitting display apparatus 100 according to an exemplary embodiment of the present disclosure. FIGS. 2A to 2E show characteristic changes of a flexible encapsulation layer formed of aluminum oxide with respect to thickness. FIG. 3 is an equivalent circuit diagram illustrating a flexible array substrate and a pixel part of FIG. 1. FIG. 4 is a cross-sectional view illustrating an example of a flexible array substrate and a pixel part for each pixel illustrated in FIG. 3.

As illustrated in FIG. 1, the flexible organic light emitting display apparatus 100 according to an exemplary embodiment of the present disclosure may include: a flexible array substrate 110 that includes a plurality of thin film transistors (TFTs) formed on a flexible substrate in a display area; a pixel part 120 that includes a plurality of organic light emitting devices formed on the flexible array substrate 110 in the display area; a flexible encapsulation layer 130 that is formed opposite to the flexible array substrate 110 with the pixel part 120 therebetween; a flexible barrier film 150 that is formed opposite to the flexible encapsulation layer 130; and an adhesion supporter 140 that is formed between the flexible encapsulation layer 130 and the flexible barrier film 150 and improves an adhesive strength of an interface between the flexible encapsulation layer 130 and the flexible barrier film 150. The flexible barrier film 150 opposite to the flexible encapsulation layer 130 may include a flexible barrier film body 152 and a PSA layer 151 that is formed on one surface of the flexible barrier film body 152.

The flexible array substrate 110 and the pixel part 120 will be described in detail with reference to FIGS. 3 and 4.

The flexible encapsulation layer 130 may be formed all over the pixel part 120 and may delay the permeation of water and oxygen. The flexible encapsulation layer 130 may include an insulation layer formed of aluminum oxide (AlxOy). In this case, the flexible encapsulation layer 130 may be formed to a thickness of 20 nm to 50 nm. In detail, thickness-based characteristic changes of an AlxOy-based insulation layer are as shown in the following Tables 1 and 2 and FIGS. 2A to 2E.

TABLE 1

| | Thickness-based unit performance of first insulation layer formed of AlxOy | | | |
|---|---|---|---|---|
| | 10 nm | 20 nm | 30 nm | 40 nm |
| WVTR (g/m²-day) | 0.0136 | 0.0078 | 0.0072 | 0.0064 |
| Density (g/cm³) | 2.85 | 2.91 | 2.91 | 2.92 |
| Refractive Index | 1.62 | 1.63 | 1.63 | 1.63 |
| Stress (Mpa) | 50 | 87 | 100 | 106 |
| Step Coverage (%) | 95 | 98 | 98 | 98 |

TABLE 2

| | Thickness-based unit performance of first insulation layer formed of AlxOy | | | |
|---|---|---|---|---|
| | 50 nm | 70 nm | 90 nm | 100 nm |
| WVTR (g/m²-day) | 0.0062 | 0.0083 | 0.0185 | 0.098 |
| Density (g/cm³) | 2.93 | 2.90 | 2.84 | 2.82 |
| Refractive Index | 1.64 | 1.62 | 1.62 | 1.61 |
| Stress (Mpa) | 108 | 167 | 248 | 280 |
| Step Coverage (%) | 100 | 100 | 96 | 95 |

Figure 2A:
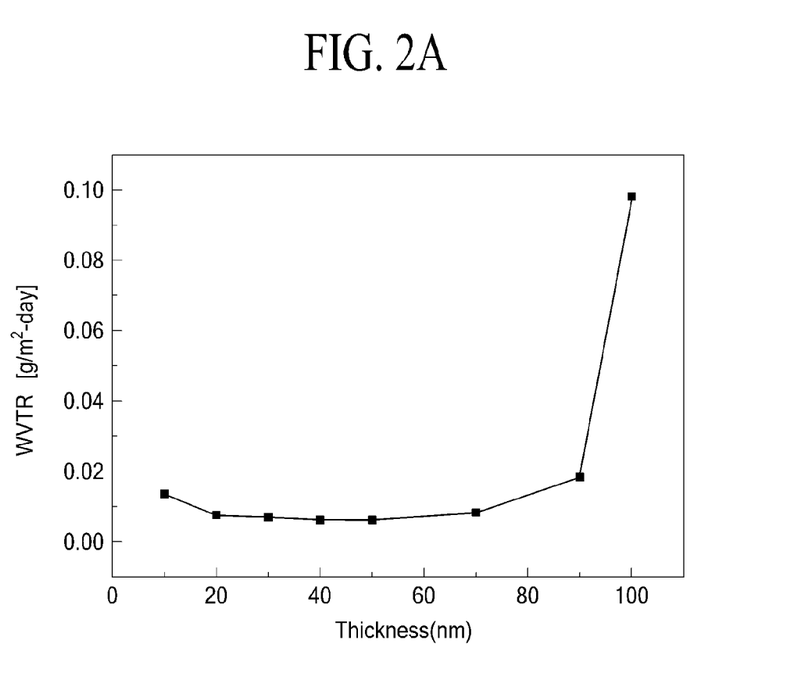
FIGS. 2A to 2E show characteristic changes of a flexible encapsulation layer formed of aluminum oxide with respect to a thickness.

As shown in Tables 1 and 2 and FIG. 2A, when a thickness of the AlxOy-based insulation layer is more than approximately 90 nm, it can be seen that a water vapor transmission rate (WVTR) [g/m²-day] increases rapidly. For reference, the WVTR may be obtained by measuring the amount of water vapor that passes through a specimen having a unit area for a unit time under a certain temperature and humidity condition. When the WVTR increases, a water/oxygen permeation delay, protection performance (encapsulation performance) of a flexible encapsulation layer is reduced.

Figure 2B:
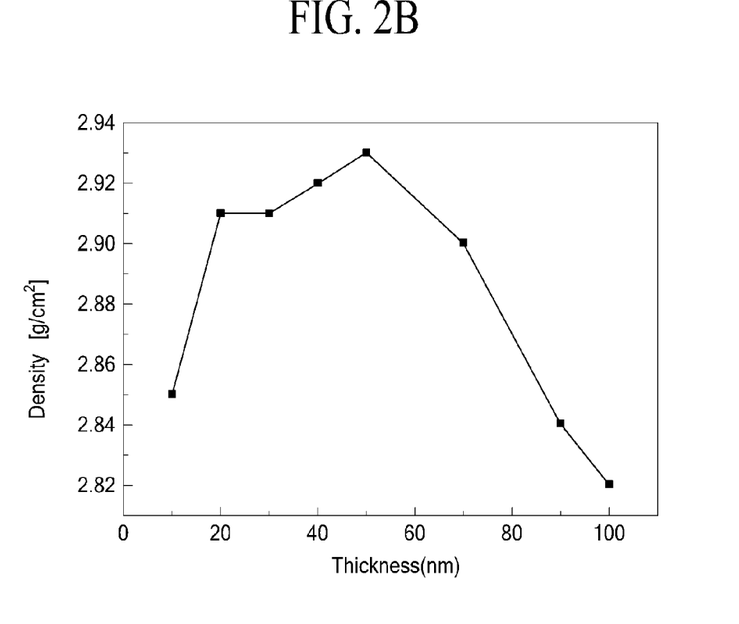

As shown in Tables 1 and 2 and FIG. 2B, when a thickness of the AlxOy-based insulation layer which is the aluminum oxide layer is less than approximately 20 nm and more than approximately 70 nm, it can be seen that the density [g/cm³] is rapidly lowered. For reference, a density may be an item indicating a dense/porous degree of a thin layer. As a density becomes lower, the WVTR increases, and for this reason, protection performance of the flexible encapsulation layer is reduced.

Figure 2C:
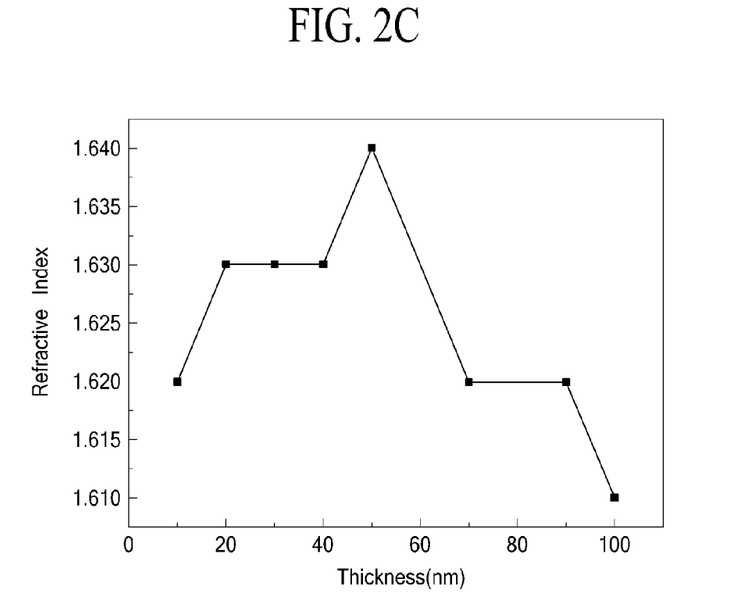

As shown in Tables 1 and 2 and FIG. 2C, when a thickness of the AlxOy-based insulation layer is less than approximately 20 nm and more than approximately 60 nm, it can be seen that a refractive index (R.I) is outside the range of 1.63 to 1.64. When a range of a refractive index of an encapsulation part through which light passes differs from a refractive index value of another layer of the flexible organic light emitting display apparatus, an image quality of the flexible organic light emitting display apparatus is degraded by refraction of light or total internal reflection based on the Snell's law.

Figure 2D:
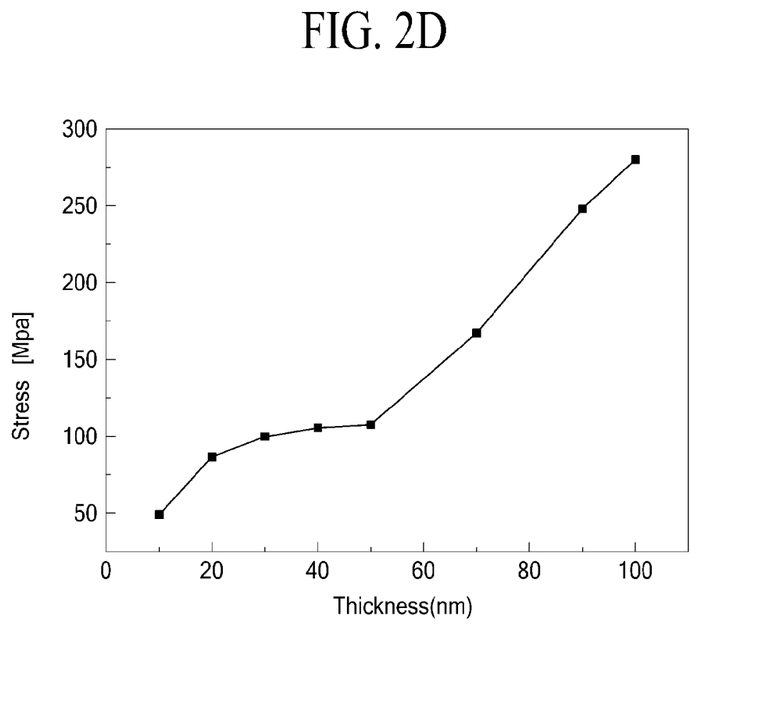

As shown in Tables 1 and 2 and FIG. 2D, when a thickness of the AlxOy-based insulation layer is more than approximately 70 nm, it can be seen that a stress [Mpa] is outside a range of 110 Mpa or less, namely, is more than 110 Mpa. For reference, a stress may denote a degree to which a crack or detachment occurs in an interface between different materials.

Figure 2E:
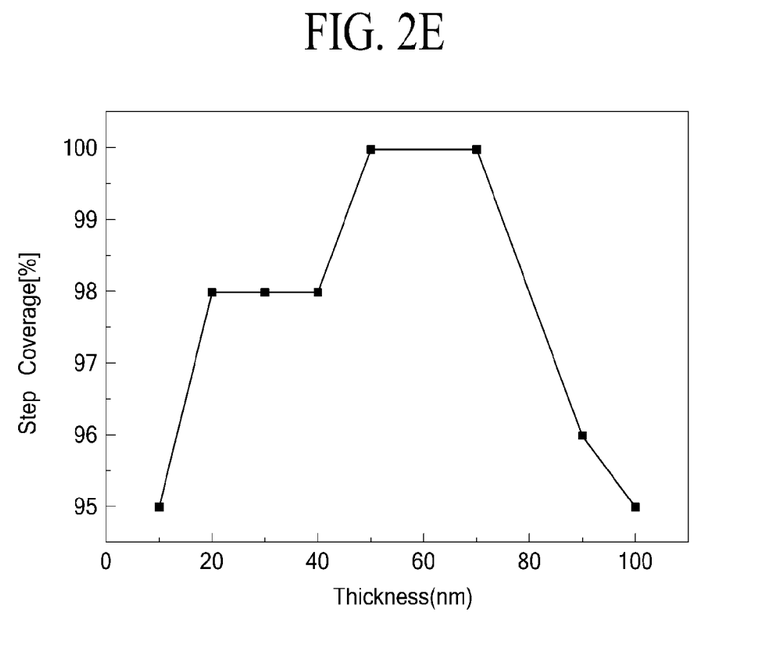

As shown in Tables 1 and 2 and FIG. 2E, when a thickness of the AlxOy-based insulation layer is less than approximately 20 nm and more than approximately 70 nm, it can be seen that step coverage is equal to or less than 98%. For reference, the step coverage may denote a degree to which an area having a certain step height or slope is uniformly covered. When the step coverage is reduced, cracks and foreign material defects are easily caused by foreign materials and interface step heights, and for this reason, defects at the flexible encapsulation layer 130 occur.

As described above, the flexible encapsulation layer 130 formed of AlxOy may be formed to a thickness of 20 nm to 50 nm in consideration of WVTR, density, refractive index, stress, and step coverage.

The flexible encapsulation layer 130 including the AlxOy-based insulation layer may have a WVTR of $5 \times 10^{-2}$ to $1 \times 10^{-4}$ g/m$^2$-day, step coverage of 90% or more, stress of 110 MPa or less, and a transmittance of 97% or more for visible light of 380 nm to 780 nm wavelength. Therefore, even when the flexible encapsulation layer 130 is formed in a single layer structure including only the AlxOy-based insulation layer, the permeation of oxygen and water into the pixel part 120 may be delayed at a certain level, and the flexible encapsulation layer 130 may be applied to the flexible organic light emitting display apparatus 100 having a top emission type. Also, if the flexible encapsulation layer 130 is formed, the flexible encapsulation layer 130 may protect the permeation of oxygen and water, and thus, an additional process may be subsequently performed in a non-vacuum condition.

In the flexible organic light emitting display apparatus 100 according to an exemplary embodiment of the present disclosure, an adhesion process of the flexible barrier film 150 may be additionally performed after a deposition process of the flexible encapsulation layer 130 including AlxOy, thereby further delaying the permeation of oxygen and water. Also, a process of adhering the flexible barrier film 150 does not have to be performed in a difficult vacuum state like an ALD process, and thus, good performance of delaying water and oxygen can be achieved by a simple process, thereby solving a difficulty of a process where a plurality of organic insulation layers and inorganic insulation layers are repeatedly deposited in a difficult vacuum state which is costly and requires a longer processing time.

In order to adhere the flexible barrier film 150 to the flexible encapsulation layer 130, the PSA layer 151 may be formed on one surface of the flexible barrier film 150. The flexible barrier film 150 may be formed of one selected from copolyester thermoplastic elastomer (COP), cycoolefin copolymer (COC), and polycarbonate (PC), but is not limited thereto. Since the flexible barrier film 150 transmits an image displayed by the pixel part 120, the flexible barrier film 150 may have an optically isotropic characteristic so as to maintain a quality of an image. In addition, the flexible encapsulation layer 130 and the adhesion supporter 140 may have an optically isotropic characteristic so as to maintain a quality of an image.

For reference, a WVTR may be varied depending on a thickness of the flexible barrier film 150. For example, as the flexible barrier film 150 becomes thicker, WVTR performance is enhanced, and as the flexible barrier film 150 becomes thinner, the WVTR performance worsens.

A thickness of the flexible barrier film 150 according to an exemplary embodiment of the present disclosure may be 35 µm to 60 µm, and for example, may be 50 µm. When the flexible barrier film 150 is formed to a thickness of 50 µm, a WVTR of the flexible barrier film 150 may have a value of $5 \times 10^{-3}$ g/m$^2$-day. Also, a WVTR of the flexible organic light emitting display apparatus 100 may be determined based on a WVTR of the flexible encapsulation layer 130 and a WVTR of the flexible barrier film 150. Therefore, the permeation of water and oxygen into the pixel part 120 may be further delayed by the flexible barrier film 150 in addition to the flexible encapsulation layer 130, and thus, lifetime and reliability of the flexible organic light emitting display apparatus 100 are improved.

For reference, a thickness of the flexible barrier film 150 may be determined based on a WVTR performance of the flexible encapsulation layer 130. For example, when a WVTR performance of the flexible encapsulation layer 130 is improved, a thickness of the flexible barrier film 150 becomes thinner. Alternatively, it may be the opposite.

The PSA layer 151 may be formed in a film form having light-transmitting properties and double-sided adhesiveness. The PSA layer 151 may be formed of one selected from an olefin-based material, an acrylic-based material, and a silicon-based material. The PSA layer 151 may be formed to a thickness of 8 µm to 50 µm. Particularly, the PSA layer 151 may be formed of an olefin-based water permeation delay material having hydrophobicity. The PSA layer 151 has a characteristic where an adhesive strength increases when a certain pressure is applied thereto. Also, when the PSA layer 151 is formed of the olefin-based water permeation delay material having hydrophobicity, the PSA layer 151 may have a WVTR of 10 g/m$^2$-day or less. Therefore, the permeation of water and oxygen into the pixel part 120 may be further delayed by the PSA layer 151 in addition to the flexible encapsulation layer 130, and thus, lifetime and reliability of the flexible organic light emitting display apparatus 100 are improved. Also, when the PSA layer 151 is formed of the olefin-based water permeation delay material having hydrophobicity, a minimum value of an adhesive strength of the PSA layer 151 may satisfy a range of 900 gf/inch or more, and for example, may be 1,000 gf/inch.

However, an adhesive strength of the PSA layer 151 is reduced due to characteristics of the interface between the flexible encapsulation layer 130 including AlxOy and the PSA layer 151 which is formed on one surface of the flexible barrier film 150. Particularly, the olefin-based PSA layer 151 is considerably reduced in adhesive strength when being adhered to the AlxOy-based flexible encapsulation layer 130. For this reason, the flexible barrier film 150 is easily detached from the flexible encapsulation layer 130.

Therefore, the flexible organic light emitting display apparatus 100 according to an exemplary embodiment of the present disclosure may further include the adhesion supporter 140 that is disposed between the flexible encapsulation layer 130 and the flexible barrier film 150. The adhesion supporter 140 may be a silicon-based insulation layer. The adhesion supporter 140 may be formed of, for example, SiNx or SiOCz. A thickness of the adhesion supporter 140 may be 2,000 Å to 5,000 Å. For example, in case the adhesion supporter 140 is formed of SiNx to have a thickness of 5,000 Å or more, it has been confirmed that there is a possibility a crack occurs in the adhesion supporter 140 when the adhesion supporter 140 is bent. The silicon-based adhesion supporter 140 has good adhesive characteristics for an interface between the adhesion supporter 140 and the flexible encapsulation layer 130 including AlxOy, and moreover has good adhesive characteristics for an interface between the adhesion supporter 140 and the PSA layer 151. Therefore, the adhesion supporter 140 may be formed on the flexible encapsulation layer 130 including AlxOy, and thus, an adhesive strength of an interface between the flexible encapsulation layer 130 and the flexible barrier film 150 is improved.

TABLE 3

|  | Before Insertion | After Insertion | Result |
|---|---|---|---|
| Adhesive strength (gf/inch) | 580 | 1030 | 78% ↑ |
| WVTR (g/m²-day) | $1.0 \times 10^{-3}$ | $8.3 \times 10^{-4}$ | 20% ↑ |

As shown in Table 3, it can be seen that an adhesive strength, which has been measured when the PSA layer 151 is adhered to the flexible encapsulation layer 130 including AlxOy, is considerably reduced than the above-described original adhesive strength of the PSA layer 151.

In this case, the inventors of the present disclosure have experimented on whether partial detachment occurs or not during a bending state where a bending curvature is set to 5 mm (bending radius=5 mm) is maintained for 24 hours or more. As an experiment result, in the flexible organic light emitting display apparatus 100 without the adhesion supporter 140, water/oxygen permeation delay performance of the flexible organic light emitting display apparatus 100 is reduced due to partial detachment which occurs in the interface between the flexible encapsulation layer 130 and the flexible barrier film 150, and for this reason, lifetime and reliability of the flexible organic light emitting display apparatus 100 can be reduced.

However, when the adhesion supporter 140 according to an exemplary embodiment of the present disclosure is inserted, an adhesive strength of an interface between the adhesion supporter 140 and the PSA layer 151 is restored to a level of the original adhesive strength, and thus, partial detachment does not occur. Also, it can be seen that a WVTR of the flexible organic light emitting display apparatus 100 is improved by 20% or more by the adhesion supporter 140.

Therefore, a possibility that the flexible barrier film 150 is detached from the flexible encapsulation layer 130 is considerably lowered by the adhesion supporter 140, and thus, lifetime and reliability of the flexible organic light emitting display apparatus 100 are enhanced. Here, the lifetime of the flexible organic light emitting display apparatus 100 denotes a time which is generally taken until a maximum luminance of a display apparatus is reduced by 50%.

As described above, the flexible organic light emitting display apparatus 100 according to an exemplary embodiment of the present disclosure may include the adhesion supporter 140 which is formed between the flexible encapsulation layer 130 and the flexible barrier film 150. Therefore, an adhesive strength between the pixel part 120 and the flexible encapsulation layer 130 is improved, and thus, the detachment of an interface caused by a bending stress is suppressed in a bending state. Accordingly, the permeation of water and/or oxygen into the pixel part 120 is more stably suppressed, and thus, a lifetime of the flexible organic light emitting display apparatus 100 is improved, and a reduction in reliability and image quality is delayed. Particularly, a reduction in lifetime, reliability, and image quality of the flexible organic light emitting display apparatus 100 is delayed even in a bending state, and thus, the flexible organic light emitting display apparatus 100 which is bent and fixed in a specific shape may be provided.

To provide an additional description, a process sequence, a material, and a thickness of each of the flexible encapsulation layer 130, the adhesion supporter 140, and the flexible barrier film 150 including the PSA layer 151 according to an exemplary embodiment of the present disclosure may be determined based on an adhesion characteristic relationship therebetween. Due to such a structure, the flexible organic light emitting display apparatus 100 according to an exemplary embodiment of the present disclosure may have a bending curvature of 5 mm, may be applied to the top emission type display device, and may have a good WVTR.

As illustrated in FIG. 3, the array substrate 110 according to an exemplary embodiment of the present disclosure may include a plurality of gate lines GL and a plurality of data lines DL, which are formed to intersect each other, and a plurality of TFTs corresponding to a plurality of pixels PA. Also, the pixel part 120 may include a plurality of organic light emitting devices ED which are provided in respective emission areas of the plurality of pixels PA. Here, each of the organic light emitting devices ED may be disposed between a driving TFT and a common voltage Vss terminal and may emit light, based on a driving current determined by a potential difference between the driving TFT and the common voltage Vss terminal.

As illustrated in FIG. 4, the array substrate 110 may include a substrate 111, which is formed of a flexible material having light-transmitting properties, and a plurality of TFT's which are formed on the substrate 111 in correspondence with each of the pixels PA. In detail, the substrate 111 may include a base layer 111a, a multi-buffer layer 111b which is formed on one surface of the base layer 111a to protect water and/or oxygen permeation, an optical adhesive layer 111c which is formed on other surface of the base layer 111a, and a back plate 111d which is coupled to the other surface of the base layer 111a through the optical adhesive layer 111c. Here, the base layer 111a may be provided as a film formed of a polyimide-based material. The multi-buffer layer 111b may be formed by stacking a plurality of insulation layers which are formed of at least one selected from an organic insulating material and an inorganic insulating material. That is, the multi-buffer layer 111b may be formed in a structure where two or more insulation layers which differ in thickness, a component, or a composition ratio are stacked together. For example, a material of the multi-buffer layer 111b may be SiNx or SiOy. The multi-buffer layer 111b suppresses causes of deterioration such as water and oxygen from permeating into an emission array EL through the substrate 111. The optical adhesive layer 111c may be selected as an optical clean adhesive (OCA) film.

The back plate 111d may be provided as a flexible substrate formed of a plastic material or a metal material. For example, the back plate 111d may be formed of a polymer plastic material such as polyethersulphone (PES), polyacrylate (PAR), polyetherrimide (PEI), polyethylenenapthalate, or polyethyleneterepthalate (PET). Alternatively, the back plate 111d may be formed of a metal material such as aluminum (Al), copper (Cu), and/or the like.

A thin film transistor TFT may include an active layer ACT, a gate electrode GE, a source electrode SE, and a drain electrode DE. The active layer ACT may be formed in at least a portion of a non-emission area of each pixel PA on the substrate 111 and may include a channel area, and a source area ACT_S and a drain area ACT_D which are disposed next to both sides of the channel area. The active layer ACT may be covered by a gate insulation layer 112 which is formed all over the substrate 111. The gate electrode GE may be formed on the gate insulation layer 112 to overlap at least the channel area of the active layer ACT. The gate electrode GE may be covered by an interlayer dielectric 113 which is formed all over the gate insulation layer 112. The source electrode SE and the drain electrode DE may be formed on the interlayer dielectric 113 to be separated from each other. In this case, the source electrode SE may overlap at least the source area ACT_S of the active layer ACT and may be connected to the source area ACT_S of the active layer ACT through a contact hole which passes through the gate insulation layer 112 and the interlayer dielectric 113. Also, the drain electrode DE may overlap at least the drain area ACT_D of the active layer ACT and may be connected to the drain area ACT_D of the active layer ACT through a contact hole which passes through the gate insulation layer 112 and the interlayer dielectric 113. The thin film transistor TFT which includes the active layer ACT, the gate electrode GE, the source electrode SE, and the drain electrode DE may be covered by an overcoat layer 114 which is formed all over the interlayer dielectric 113. Each of a plurality of light emitting devices ED may include first and second electrodes EX1 and EX2 which are opposite to each other, an emission layer EL which is disposed therebetween, and a bank BK which is formed in the non-emission area of each pixel PA.

The first electrode EX1 may be formed on an area of the overcoat layer 114 corresponding to an emission area of each pixel PA and may be connected to the drain electrode DE of the thin film transistor TFT through a pixel contact hole CTH which passes through the overcoat layer 114. The bank BK may be formed on the overcoat layer 114 in an area corresponding to the non-emission area of each pixel PA and may be formed in order for at least a portion of the bank BK to overlap a border of the first electrode EX1.

The emission layer EL may be formed on the first electrode EX1. The second electrode EX2 may be formed opposite to the first electrode EX1 with the emission layer EL therebetween. The common voltage Vss may be applied to the second electrode EX2.

Unlike the organic light emitting display apparatus 100 according to an exemplary embodiment of the present disclosure, the encapsulation layer 130 may be formed of a triple layer instead of a single layer formed of AlxOy.

Figure 5A:
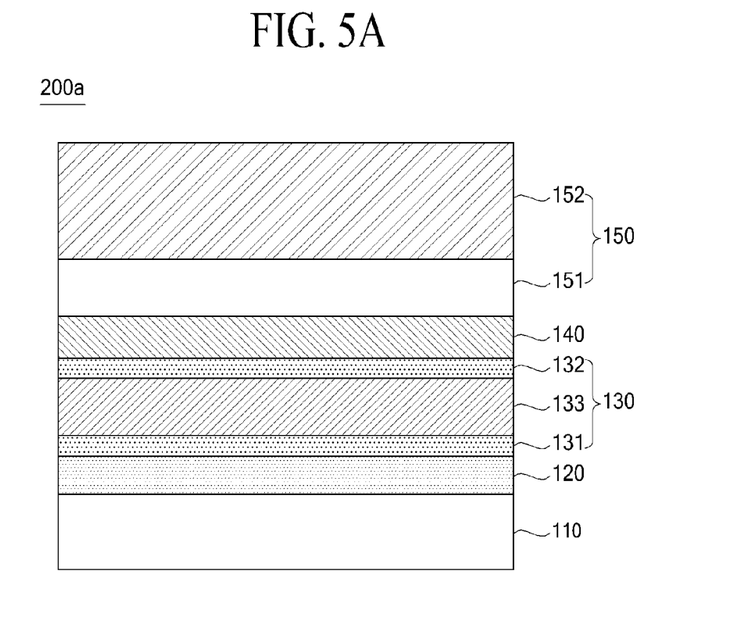
FIGS. 5A to 5C are cross-sectional views illustrating a portion of a flexible organic light emitting display apparatus according to another exemplary embodiment of the present disclosure.
Figure 5B:
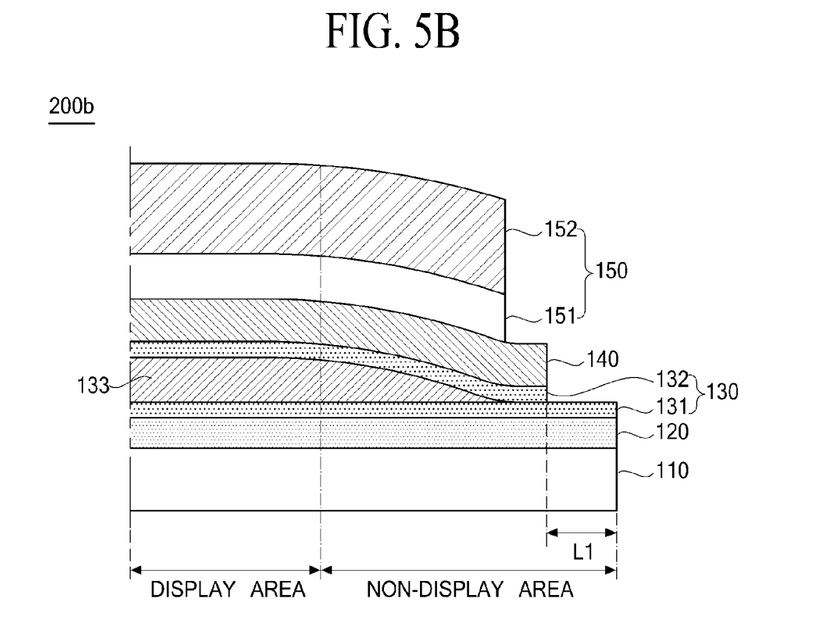
Figure 5C:
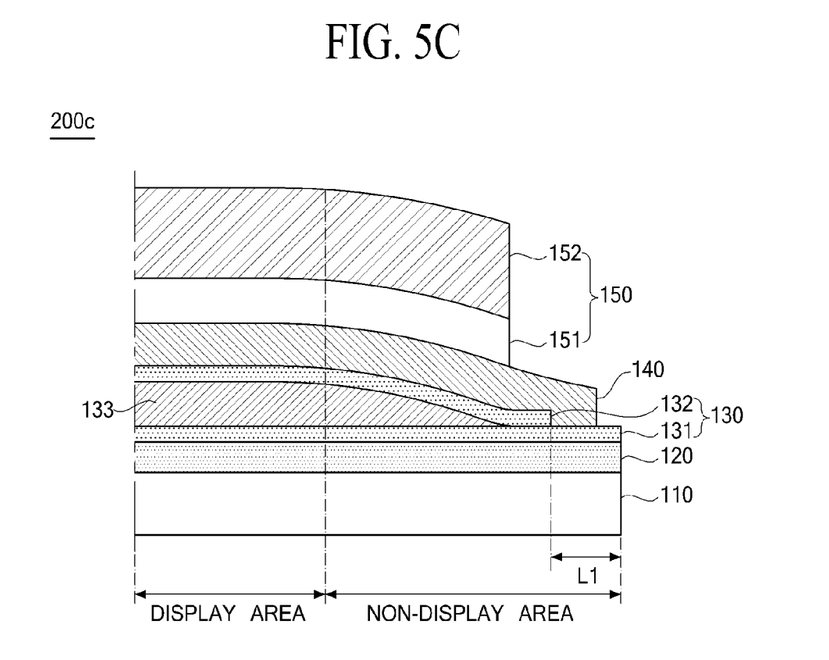

FIGS. 5A to 5C are cross-sectional views illustrating a portion of a flexible organic light emitting display apparatus 200a according to another exemplary embodiment of the present disclosure.

As illustrated in FIG. 5A, the flexible organic light emitting display apparatus 200a according to another exemplary embodiment of the present disclosure may include a flexible encapsulation layer 130 which is formed of a triple layer.

The flexible encapsulation layer 130 of the flexible organic light emitting display apparatus 200a may include a first insulation layer 131 including AlxOy, a second insulation layer 132 including AlxOy, and a foreign material compensation layer 133 which is formed between the first insulation layer 131 and the second insulation layer 132. With the exception of the portions explained above, the flexible organic light emitting display apparatus 200a according to another exemplary embodiment is identical to the flexible organic light emitting display apparatus 100 of a previous exemplary embodiment, and thus redundant features will not be described (merely for the sake of brevity).

The foreign material compensation layer 133 may be referred to as a particle covering layer (PLC) and may compensate for a foreign material which occurs in a manufacturing process. To provide a detailed description, a thickness of the first insulation layer 121 including AlxOy has a thin thickness of 20 nm to 50 nm, and thus, when a foreign material having a thickness of 50 nm or more occurs in the manufacturing process, a defect may occur despite excellent step coverage of the insulation layer including AlxOy. Therefore, the foreign material compensation layer 133 having flowability for effectively covering the foreign material may be formed between the first insulation layer 131 and the second insulation layer 132, thereby removing a defect caused by the foreign material. In addition, a thickness of the foreign material compensation layer 133 may be changed based on a quality control level of foreign particles in a manufacturing process.

The foreign material compensation layer 133 may use SiOCz or an epoxy-based resin. For example, when foreign material compensation layer 133 is formed of SiOCz, it is required to control an atom ratio of carbon to silicon (C/Si). To provide a detailed description, a flowability of SiCOz may be changed based on the C/Si ratio. According to an experiment result, when the C/Si ratio is equal to or more than about 1.05, flowability is reduced, and when the C/Si ratio is equal to or less than 1.0, flowability is improved, and thus, a foreign material is easily compensated for. Therefore, the C/Si ratio may be set to 1.0 or less in implementing the foreign material compensation layer 133. Also, when a deposition process temperature is controlled to 60 degrees C. or less, flatness of the foreign material compensation layer 133 is improved, and thus, a foreign material is easily covered, and a defect caused by the foreign material is removed in forming the second insulation layer 132 on a top of the foreign material compensation layer 133.

The C/Si ratio of SiCOz may be controlled by controlling a ratio of oxygen ($O_2$) to hexamethyldisiloxane (HMDSO) in a chemical vapor deposition (CVD) process. A thickness of the foreign material compensation layer 133 formed of SiOCz may be set to a range of 2 μm to 4 μm, and for example, may be set to 3 μm. Particularly, when the foreign material compensation layer 133 is formed of SiOCz, a thickness of the foreign material compensation layer 133 may be implemented as a thin thickness of 2.04 μm to 4.1 μm, and thus, a bending performance of the flexible organic light emitting display apparatus 200a can be improved.

For example, when the foreign material compensation layer 133 is formed of an epoxy-based resin, the epoxy-based resin may use bisphenol-A-epoxy having high viscosity or bisphenol-F-epoxy having low viscosity. The epoxy-based resin may further contain an additive. For example, a wetting agent for decreasing a surface tension of a resin, a leveling agent for improving surface flatness of the resin, and a defoaming agent for removing an air bubble included in the resin may be further added for improving a uniformity of the resin. For example, an antimony-based initiator or an anhydride-based initiator for initiating a chain reaction with heat to harden a liquid resin may be selected and used. A thickness of the foreign material compensation layer 133 formed of the epoxy-based resin may be set to a range of 15 μm to 25 μm.

As described above, when the flexible encapsulation layer 130 is formed of a triple layer which includes at least one of the first insulation layer 131 the second insulation layer 132, and the foreign material compensation layer 133, a WVTR and a degree of improvement of a foreign material defect are enhanced, and thus, lifetime and reliability of the flexible organic light emitting display apparatus 200a are enhanced.

As illustrated in FIG. 5B, a side portion of at least one of borders of the flexible organic light emitting display apparatus 200b according to yet another exemplary embodiment of the present disclosure may be formed to have an separation distance.

The second insulation layer 132 may be disposed more inward than the first insulation layer 131 by a distance L1. The distance L1 may be 200 μm to 2,000 μm, and for example, may be 500 μm. The foreign material compensation layer 133 may be planarized in the display area and may be formed to have a shape which is progressively thinned in a non-display area. For example, the upper surface of the foreign material compensation layer at the non-display area is curved. This is based on a flowability characteristic of the foreign material compensation layer 133. In a progressively thinned area, a curved surface occurs, and for this reason, light is refracted. Therefore, to avoid any light refraction which is emitted from the plurality of light emitting devices ED, the foreign material compensation layer 133 may be formed in the non-display area. The adhesion supporter 140 may be formed to correspond to the second insulation layer 132. The flexible barrier film 150 may be formed more inward than the adhesion supporter 140. With the exception of the portions explained above, the flexible organic light emitting display apparatus 200b according to yet another exemplary embodiment is identical to the flexible organic light emitting display apparatus 200a of a previous exemplary embodiment, and thus redundant features will not be described (merely for the sake of brevity).

As described above, since the side portion of at least one of the borders of the flexible organic light emitting display apparatus 200b has a separation distance, it is easy to secure a process margin, and an open mask may be applied for forming the first insulation layer 131. Also, since the second insulation layer 132 and the adhesion supporter 140 are formed to conform to the upper surface of the foreign material compensation layer 133, a thickness of the layers may be further thinned in a certain region of the non-display area, and thus, it is further easy to bend the non-display area. In addition, due to its curvature of the flexible insulation layer 130 at the non-display area, the flexible barrier film 150 at the non-display area is bent and in such case, the adhesion supporter 140 can suppress delamination. Accordingly, lifetime and reliability of the flexible organic light emitting display apparatus 200b are further improved.

As illustrated in FIG. 5C, a flexible organic light emitting display apparatus 200c according to yet another exemplary embodiment of the present disclosure may include an adhesion supporter 140 which is formed to cover a side surface of the second insulation layer 132.

When the adhesion supporter 140 is formed to cover a side surface of the second insulation layer 132, water is suppressed from permeating into the flexible organic light emitting display apparatus 200c through the foreign material compensation layer 133 due to a crack which occurs in a region where the first insulation layer 131 contacts the second insulation layer 132. With the exception of the portions explained above, the flexible organic light emitting display apparatus 200c according to yet another exemplary embodiment is identical to the flexible organic light emitting display apparatus 200b of a previous exemplary embodiment, and thus redundant features will not be described (merely for the sake of brevity).

As described above, since the adhesion supporter 140 of the flexible organic light emitting display apparatus 200c covers a side surface of the second insulation layer 132, a permeation path to the foreign material compensation layer 133 caused by a crack which may occur in an adhered surface between the interface of the first insulation layer 131 and the interface of the second insulation layer 132 can be further protected, and thus, lifetime and reliability of the flexible organic light emitting display apparatus 200c are enhanced.

Figure 6:
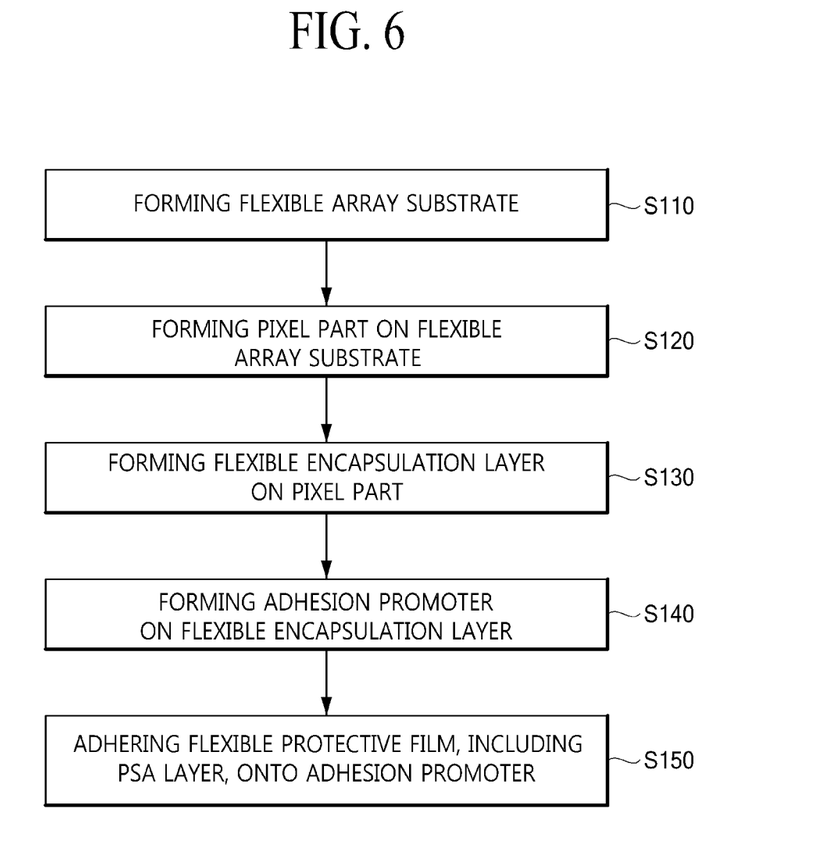
FIG. 6 is a flowchart illustrating a method of manufacturing a flexible organic light emitting display apparatus, according to an exemplary embodiment of the present disclosure.

Hereinafter, a method of manufacturing a flexible organic light emitting display apparatus according to an exemplary embodiment of the present disclosure will be described in detail with reference to FIGS. 6 and 7A to 7E. As illustrated in FIG. 6, a method of manufacturing the flexible organic light emitting display apparatus 100 according to an exemplary embodiment of the present disclosure may include operation S110 of forming the flexible array substrate 110, operation S120 of forming the pixel part 120 on the flexible array substrate 110, operation S130 of forming the flexible encapsulation layer 130 on the pixel part 120, operation S140 of forming the adhesion supporter 140 on the flexible encapsulation layer 130, and operation S150 of adhering the flexible barrier film 150, including the PSA layer 151, onto the adhesion supporter 140.

Figure 7A:
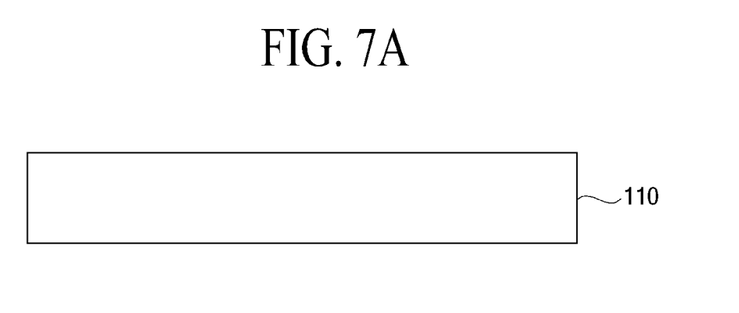
FIGS. 7A to 7E are process diagrams illustrating respective operations of FIG. 6.

As illustrated in FIG. 7A, the flexible array substrate 110 that includes the plurality of thin film transistors (TFTs) formed on the flexible substrate in an area corresponding to the display area may be formed in operation S110.

Figure 7B:
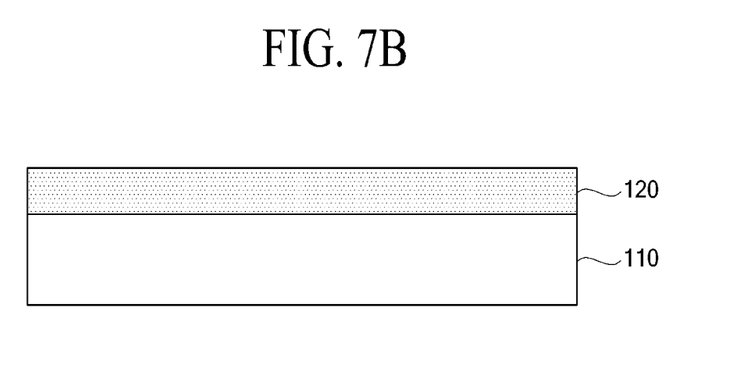

As illustrated in FIG. 7B, the pixel part 120 that includes the plurality of organic light emitting devices ED formed on the flexible array substrate 110 in an area corresponding to the display area may be provided in operation S120.

Figure 7C:
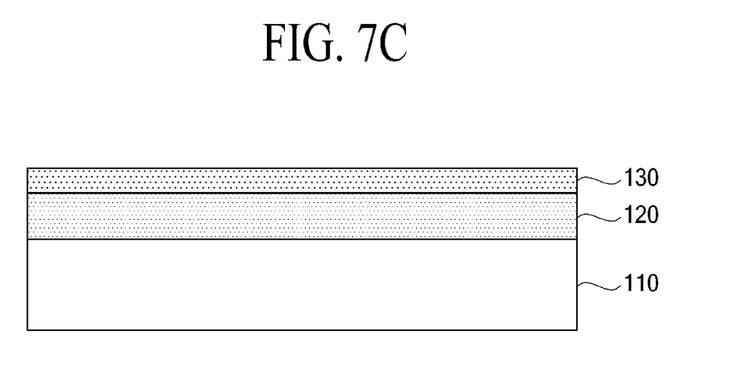

As illustrated in FIG. 7C, in operation S130, the flexible encapsulation layer 130 may be formed on the flexible array substrate 110. Here, the flexible encapsulation layer 130 may be formed of at least one aluminum oxide layer having a thickness of 20 nm to 50 nm. Also, the flexible encapsulation layer 130 may be formed of a single layer or a triple layer. When the flexible encapsulation layer 130 is formed of a triple layer, the flexible encapsulation layer 130 may be formed by sequentially stacking the first insulation layer 131, the foreign material compensation layer 133, and the second insulation layer 132. In this case, the first insulation layer 131 may be an aluminum oxide layer having a thickness of 20 nm to 50 nm, the second insulation layer 132 may be an aluminum oxide layer having a thickness of 20 nm to 50 nm, and the foreign material compensation layer 133 may use SiCOz or an epoxy-based resin. In forming SiCOz, a ratio of oxygen ($O_2$) to HMDSO may be controlled so that a process temperature is equal to or lower than 60 degrees C. and a C/Si ratio is equal to or less than 1.00. Therefore, flatness and flowability of the foreign material compensation layer 133 make it easy to compensate for a foreign material.

Figure 7D:
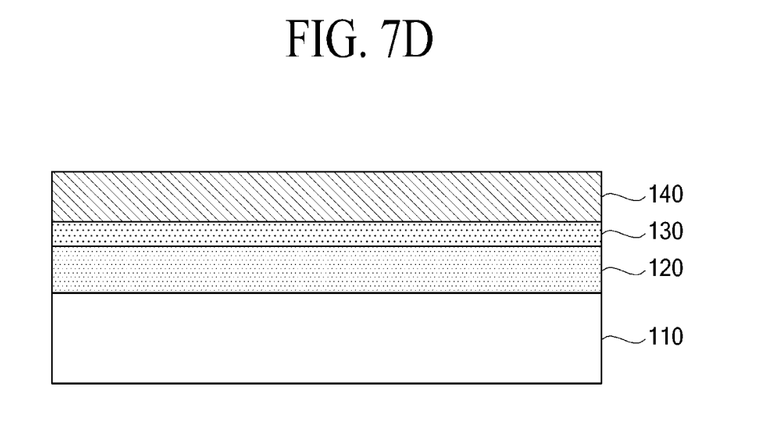

As illustrated in FIG. 7D, in operation S140, the adhesion supporter 140 may be formed on the flexible encapsulation layer 130. In this case, a thickness of the adhesion supporter 140 may be set to a range of 2,000 Å to 5,000 Å. Therefore, an adhesive strength of an interface of the flexible encapsulation layer 130 is improved.

Figure 7E:
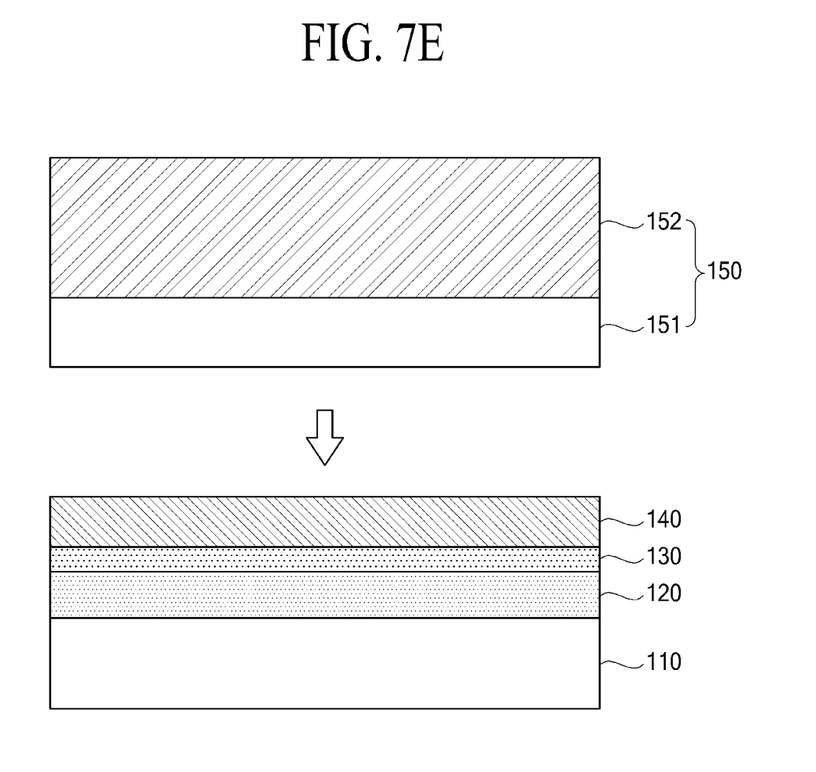

As illustrated in FIG. 7E, in operation S150, the flexible barrier film 150 including the PSA layer 151 may be adhered onto the adhesion supporter 140. Therefore, according to an exemplary embodiment of the present disclosure, an organic light emitting display apparatus that can be used as a flexible display apparatus may be manufactured.

The exemplary embodiments of the present disclosure can also be described as follows: a flexible organic light emitting display apparatus comprising a flexible encapsulation layer comprising at least one aluminum oxide layer configured to cover an area having a plurality of pixels, a flexible barrier film comprising a flexible barrier film body, and a pressure sensitive adhesive layer on the flexible encapsulation layer and an adhesion supporter directly contacting the aluminum oxide layer and the pressure sensitive adhesive layer.

The adhesion supporter is between the aluminum oxide layer and the pressure sensitive adhesive layer. The adhesion supporter is a silicon-based insulation layer having increased adhesive strength between the flexible encapsulation layer and the flexible barrier film, when compared to a flexible organic light emitting display apparatus that does not have the adhesion supporter. The flexible encapsulation layer is in a bent shape and the adhesion supporter is configured to suppress delamination between the flexible encapsulation layer and the flexible barrier film. The flexible encapsulation layer has a triple-layer structure where a first insulation layer, a second insulation layer, and a foreign material compensation layer are stacked, and the foreign material compensation layer is between the first insulation layer and the second insulation layer, and the second insulation layer is the aluminum oxide layer. The flexible encapsulation layer, the adhesion supporter and the flexible barrier film are optically transparent and isotropic such that light emitted from the plurality of pixels passes through the flexible encapsulation layer, the adhesion supporter, and the flexible barrier film.

A flexible organic light emitting display apparatus comprising a display area comprising a plurality of pixels, a non-display area at a periphery of the display area, a flexible encapsulation layer comprising at least one aluminum oxide layer on the plurality of pixels, an adhesion supporter on the flexible encapsulation layer, and a flexible barrier film adhered to the adhesion supporter.

The flexible encapsulation layer comprising a first insulation layer, a foreign material compensation layer on the first insulation layer and a second insulation layer on the foreign material compensation layer, wherein at least the second insulation layer is the aluminum oxide layer. The foreign material compensation layer is configured to be planar in the display area and is configured to be progressively thinned in the non-display area such that the upper surface of the foreign material compensation layer at the non-display area is curved. An edge of the second insulation layer at the non-display area is disposed more inward than an edge of the first insulation layer at the non-display area by a certain distance and the adhesion supporter is configured to cover a side surface of the edge of the second insulation layer and a portion of an upper surface of the first insulation layer. The thickness of the aluminum oxide layer is 20 nm to 50 nm. A water vapor transmission ratio of the aluminum oxide layer is $5\times10^{-2}$ to $1\times10^{-4}$ g/m²-day. An overall thickness of the first and second insulation layers is 40 nm to 100 nm and a thickness of a foreign material compensation layer is 3 μm to 20 μm. A thickness of the adhesion supporter is 2,000 Å to 5,000 Å. An adhesive strength of an interface between the flexible encapsulation layer and the flexible barrier film is equal to or more than 900 gf/inch.

Advantages and features of the present disclosure, and implementation methods thereof will be clarified through following exemplary embodiments described with reference to the accompanying drawings. The present disclosure may, however, be embodied in different forms and should not be construed as limited to the exemplary embodiments set forth herein. Rather, these exemplary embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing exemplary embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In describing a position relationship, for example, when a position relation between two parts is described as 'on~', 'over~', 'under~', and 'next~', one or more other parts may be disposed between the two parts unless 'just' or 'direct' is used.

In construing an element, the element is construed as including an error range although there is no explicit description.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Features of various exemplary embodiments of the present disclosure may be partially or overall coupled to or combined with each other, and may be variously inter-operated with each other and driven technically as those skilled in the art can sufficiently understand. The exemplary embodiments of the present disclosure may be carried out independently from each other, or may be carried out together in co-dependent relationship.

The flexible organic light emitting display apparatus according to the exemplary embodiments of the present disclosure includes the adhesion supporter that increases an adhesive strength of an interface between the flexible encapsulation layer including aluminum oxide and the PSA layer which is formed on one surface of the flexible barrier film, and improves performance of delaying the permeation of water. Also, the flexible barrier film is not easily detached even when the flexible organic light emitting display apparatus is used for a long time, and thus, reliability of the flexible organic light emitting display apparatus is improved. In addition, performance of delaying the permeation of water is improved by the adhesion supporter. Also, a thin flexible encapsulation layer is formed by using aluminum oxide. Accordingly, in the flexible organic light emitting display apparatus according to the exemplary embodiments of the present disclosure, partial detachment is prevented from occurring between the flexible barrier film and the flexible encapsulation layer, and thus, reliability and lifetime are improved.

The effects of the present disclosure are not limited to the aforesaid, but other effects not described herein will be clearly understood by those skilled in the art from descriptions below.

The details of the present disclosure described in technical problem, technical solution, and advantageous effects do not specify essential features of claims, and thus, the scope of claims is not limited by the details described in detailed description of the disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A flexible organic light emitting display apparatus comprising:
   a flexible encapsulation layer comprising at least one aluminum oxide layer configured to cover an area having a plurality of pixels;
   a flexible barrier film comprising a flexible barrier film body and a pressure sensitive adhesive layer on the flexible encapsulation layer; and
   an adhesion supporter directly contacting the at least one aluminum oxide layer and the pressure sensitive adhesive layer,
   wherein the flexible encapsulation layer comprises a first insulation layer, a foreign material compensation layer on the first insulation layer, and a second insulation layer on the foreign material compensation layer,
   wherein the second insulation layer is the at least one aluminum oxide layer,
   wherein the foreign material compensation layer is configured to planarize a display area and is configured to be progressively thinned in a non-display area such that an upper surface of the foreign material compensation layer at the non-display area is curved, and
   wherein an edge of the second insulation layer at the non-display area is disposed more inward than an edge of the first insulation layer at the non-display area by a certain distance and the adhesion supporter is configured to cover a side surface of the edge of the second insulation layer and a portion of an upper surface of the first insulation layer.

2. The flexible organic light emitting display apparatus of claim 1, wherein the adhesion supporter is between the at least one aluminum oxide layer and the pressure sensitive adhesive layer.

3. The flexible organic light emitting display apparatus of claim 2, wherein the flexible encapsulation layer is in a bent shape and the adhesion supporter is configured to suppress delamination between the flexible encapsulation layer and the flexible barrier film.

4. The flexible organic light emitting display apparatus of claim 3, wherein the adhesion supporter is a silicon-based insulation layer that provides an increased adhesive strength between the flexible encapsulation layer and the flexible barrier film, when compared to a flexible organic light emitting display apparatus that does not have the adhesion supporter.

5. The flexible organic light emitting display apparatus of claim 3, wherein the flexible encapsulation layer has a triple-layer structure where the first insulation layer, the second insulation layer, and the foreign material compensation layer are stacked.

6. The flexible organic light emitting display apparatus of claim 1, wherein the flexible encapsulation layer, the adhesion supporter and the flexible barrier film are optically transparent and isotropic such that light emitted from the plurality of pixels passes through the flexible encapsulation layer, the adhesion supporter and the flexible barrier film.

7. A flexible organic light emitting display apparatus comprising:
   a display area comprising a plurality of pixels;
   a non-display area at a periphery of the display area;
   a flexible encapsulation layer comprising at least one aluminum oxide layer on the plurality of pixels;
   an adhesion supporter on the flexible encapsulation layer; and
   a flexible barrier film adhered to the adhesion supporter,
   wherein the flexible encapsulation layer comprises a first insulation layer, a foreign material compensation layer on the first insulation layer, and a second insulation layer on the foreign material compensation layer,
   wherein the second insulation layer is the at least one aluminum oxide layer,
   wherein the foreign material compensation layer is configured to planarize the display area and is configured to be progressively thinned in the non-display area such that an upper surface of the foreign material compensation layer at the non-display area is curved, and
   wherein an edge of the second insulation layer at the non-display area is disposed more inward than an edge of the first insulation layer at the non-display area by a certain distance and the adhesion supporter is configured to cover a side surface of the edge of the second insulation layer and a portion of an upper surface of the first insulation layer.

8. The flexible organic light emitting display apparatus of claim 7, wherein a thickness of the at least one aluminum oxide layer is 20 nm to 50 nm.

9. The flexible organic light emitting display apparatus of claim 8, wherein a water vapor transmission ratio of the at least one aluminum oxide layer is $5 \times 10^{-2}$ to $1 \times 10^{-4}$ g/m$^2$-day.

10. The flexible organic emitting display apparatus of claim 8, wherein an overall thickness of the first and second insulation layers is 40 nm to 100 nm and a thickness of the foreign material compensation layer is 3 μm to 20 μm.

11. The flexible organic emitting display apparatus of claim 7, wherein a thickness of the adhesion supporter is 2,000 Å to 5,000 Å.

12. The flexible organic emitting display apparatus of claim 11, wherein an adhesive strength of an interface between the flexible encapsulation layer and the flexible barrier film is equal to or more than 900 gf/inch.

* * * * *